(12) United States Patent
Sugiyama et al.

(10) Patent No.: US 8,094,920 B2
(45) Date of Patent: Jan. 10, 2012

(54) SYSTEM AND METHOD OF IMAGE PROCESSING, AND SCANNING ELECTRON MICROSCOPE

(75) Inventors: Akiyuki Sugiyama, Hitachinaka (JP); Hiroyuki Shindo, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1015 days.

(21) Appl. No.: 11/520,800

(22) Filed: Sep. 14, 2006

(65) Prior Publication Data

US 2007/0092129 A1 Apr. 26, 2007

(30) Foreign Application Priority Data

Sep. 14, 2005 (JP) .................. 2005-267506

(51) Int. Cl.
*G06K 9/00* (2006.01)
*G06K 9/36* (2006.01)
*G06K 9/46* (2006.01)

(52) U.S. Cl. ........ 382/141; 382/144; 382/145; 382/147; 382/149; 382/151; 382/205; 382/288

(58) Field of Classification Search .................. 382/141, 382/144, 145, 147, 149, 151, 199, 205, 288
See application file for complete search history.

(56) References Cited

U.S. PATENT DOCUMENTS

| | | | | |
|---|---|---|---|---|
| 4,958,939 A | * | 9/1990 | Samad | 382/223 |
| 5,038,380 A | * | 8/1991 | Morimoto et al. | 382/151 |
| 5,321,770 A | * | 6/1994 | Huttenlocher et al. | 382/174 |
| 5,600,733 A | * | 2/1997 | MacDonald et al. | 382/144 |
| 5,825,914 A | * | 10/1998 | Tsuboi et al. | 382/151 |
| 5,911,003 A | * | 6/1999 | Sones | 382/162 |
| 6,556,710 B2 | * | 4/2003 | Pass et al. | 382/170 |

(Continued)

FOREIGN PATENT DOCUMENTS

JP 2002-328015 A 11/2002

OTHER PUBLICATIONS

Utsumi, et al. "Direct manipulation interface using multiple cameras for hand gesture recognition." 1998 International Conference on Multimedia Computing and Systems. 28. (1998): 264-267. Print.*
Borgefors. "Hierarchical Chamfer Matching: A Parametric Edge Matching Algorithm." IEEE Transactions on Pattern Analysis and Machine Intelligence. 10.6 (1988): 849-865. Print.*

(Continued)

*Primary Examiner* — Matthew Bella
*Assistant Examiner* — Michael A Newman
(74) *Attorney, Agent, or Firm* — McDermott Will & Emery LLP

(57) ABSTRACT

A scanning electron microscope comprises an image processing system for carrying out a pattern matching between a first image and a second image. The image processing system comprises: a paint-divided image generator for generating a paint divided image based on the first image; a gravity point distribution image generator for carrying out a smoothing process of the paint divided image and generating a gravity point distribution image; an edge line segment group generation unit for generating a group of edge line segments based on the second image; a matching score calculation unit for calculating a matching score based on the gravity point distribution image and the group of edge line segments; and a maximum score position detection unit for detecting a position where the matching score becomes the maximum.

9 Claims, 11 Drawing Sheets

U.S. PATENT DOCUMENTS

| | | | | |
|---|---|---|---|---|
| 6,765,651 B1* | 7/2004 | Fiekowsky et al. | | 355/77 |
| 7,026,615 B2 | 4/2006 | Takane et al. | | |
| 7,082,225 B2* | 7/2006 | Endo et al. | | 382/291 |
| 7,177,480 B2* | 2/2007 | Ikeda et al. | | 382/259 |
| 7,274,820 B2* | 9/2007 | Mitsui | | 382/199 |
| 7,324,661 B2* | 1/2008 | Kemp et al. | | 382/100 |
| 7,466,872 B2* | 12/2008 | Oh et al. | | 382/266 |
| 2002/0158199 A1* | 10/2002 | Takane et al. | | 250/310 |
| 2005/0024361 A1* | 2/2005 | Ikeda et al. | | 345/441 |

OTHER PUBLICATIONS

Borgefors "Hierarchical Chamfer Matching: A Parametric Edge Matching Algorithm." IEEE Transactions on Pattern Analysis and Machine Intelligence. 10.6 (1988): 849-865.*

Utsumi et al. "Direct manipulation interface using multiple cameras for hand gesture recognition." 1998 International Conference on Multimedia Computing and Systems. 28. (1998): 264-267. Print.*

* cited by examiner

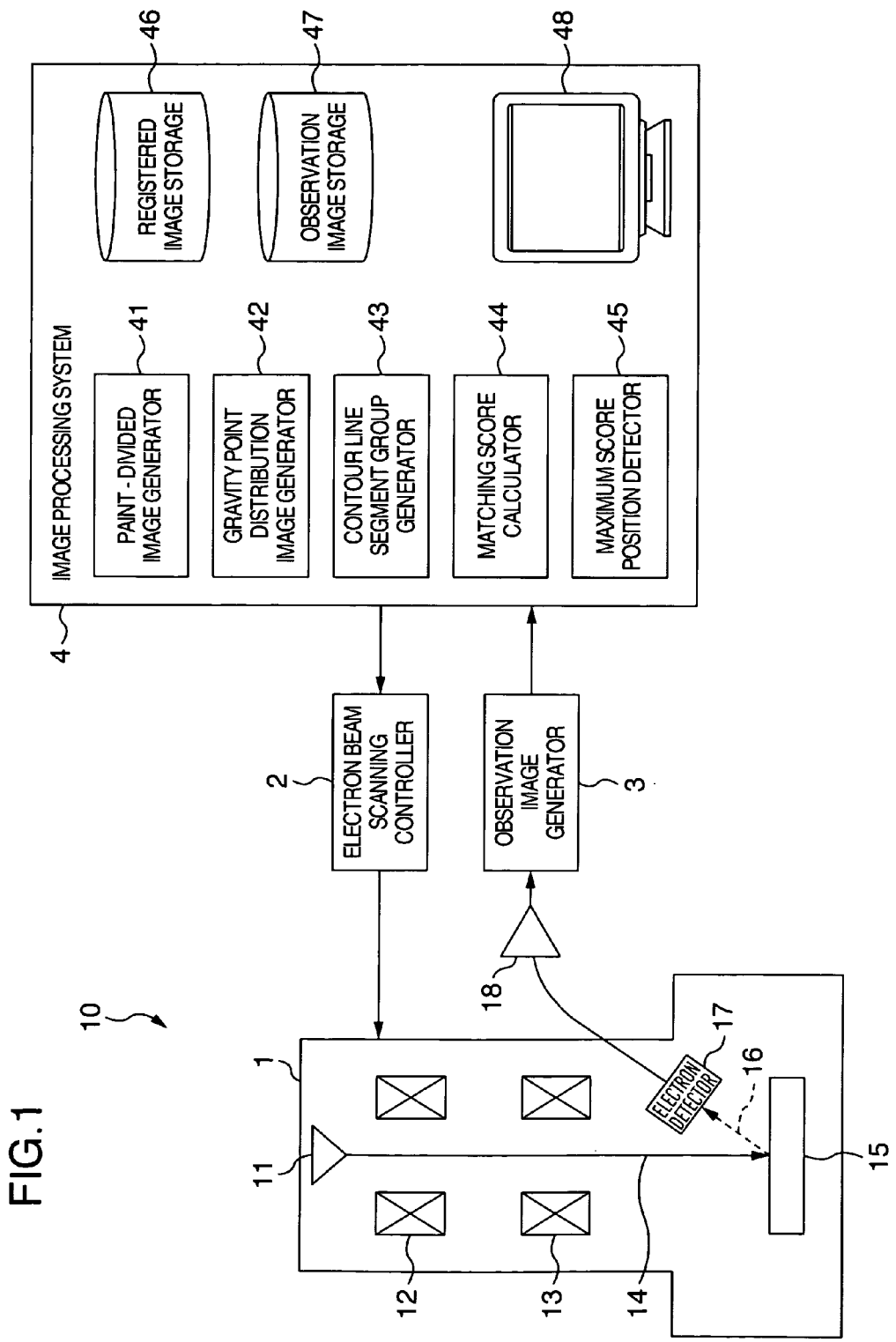

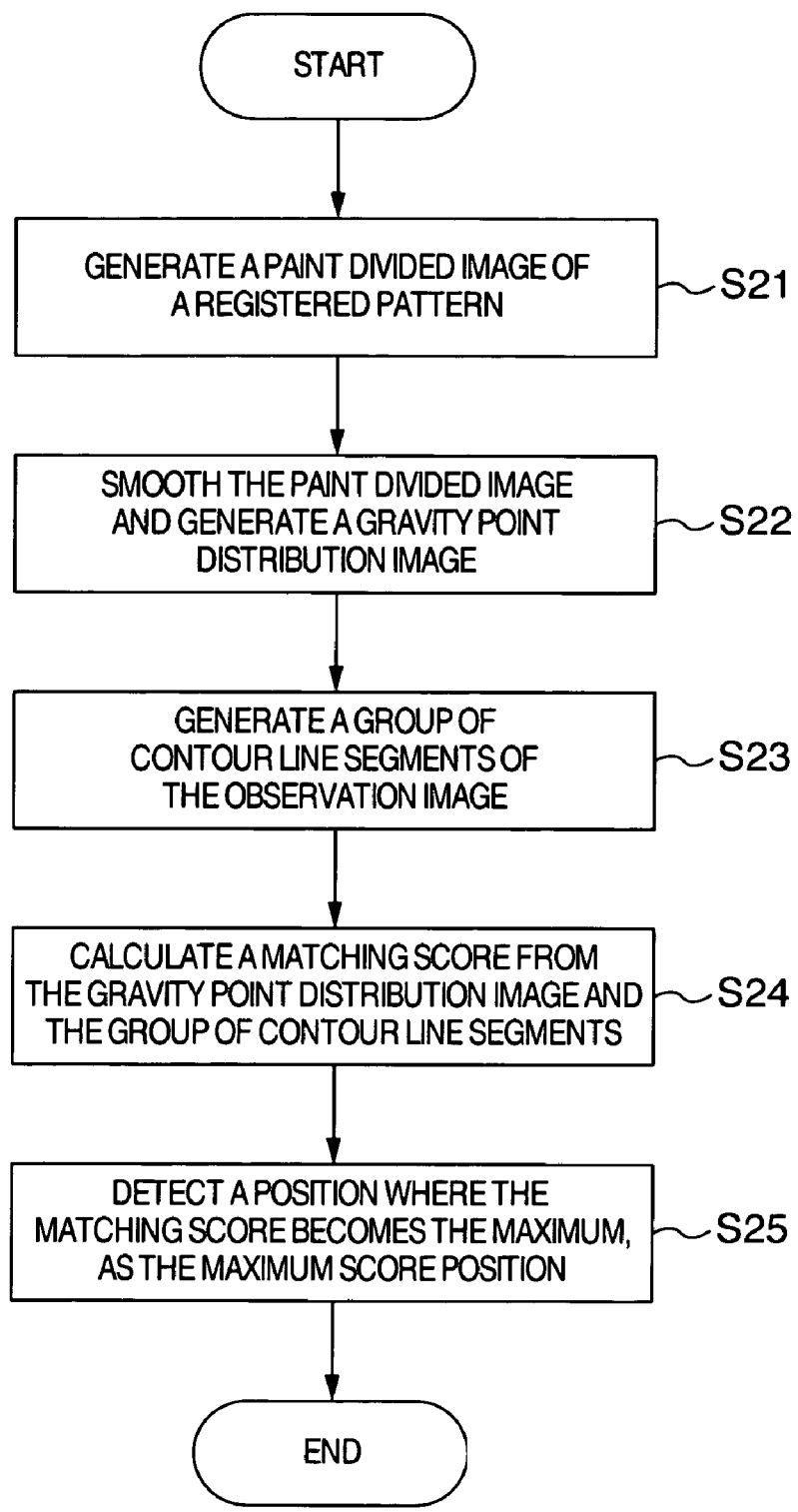

FIG.5A
501
502
FIG.5B
503
504
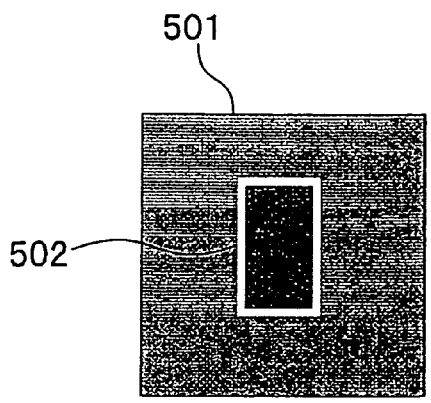
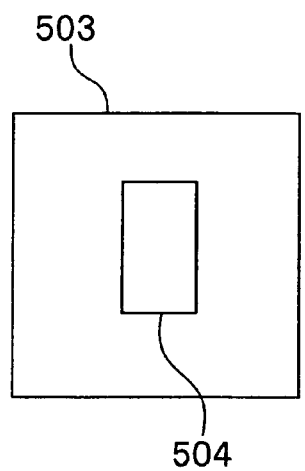
FIG.5C
505
FIG.5D
506 GRAVITY POINT DISTRIBUTION IMAGE
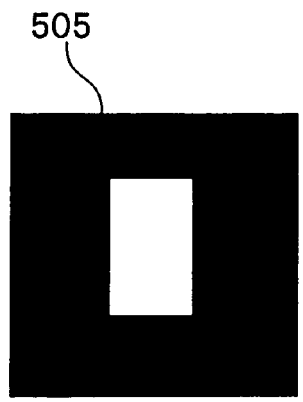
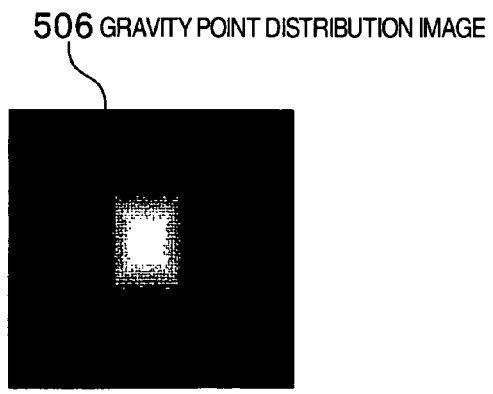

FIG.7A
701
702
FIG.7B
703
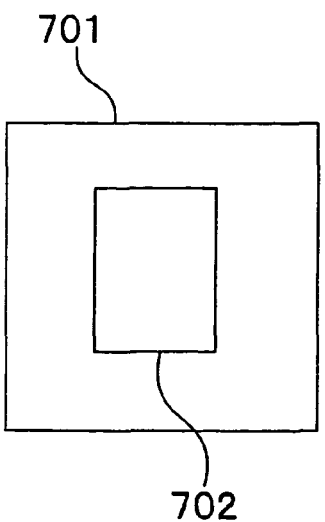
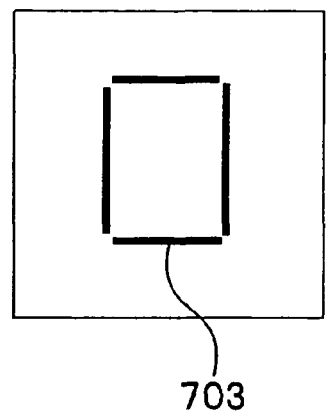
FIG.8A
801
802
FIG.8B
803
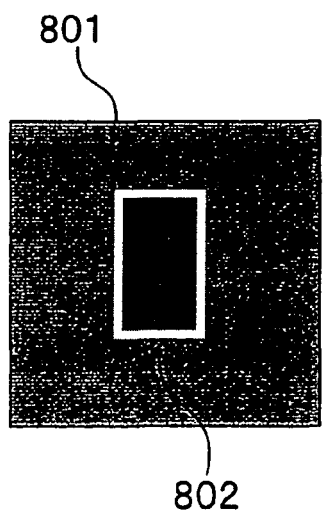
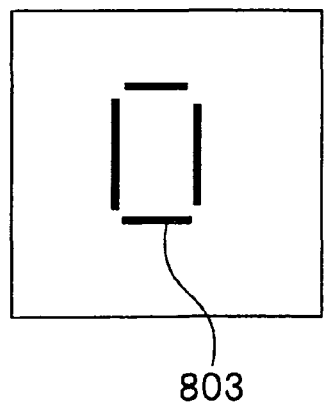

1201

1202

1203

1204

SYSTEM AND METHOD OF IMAGE PROCESSING, AND SCANNING ELECTRON MICROSCOPE

BACKGROUND OF THE INVENTION

1. Field of the Invention

The present invention relates to an image processing system for carrying out a pattern matching between two images and a method of processing images, as well as a scanning electron microscope provided with this image processing system.

2. Description of the Related Art

In recent years, in order to control or inspect the manufacturing process of a semiconductor wafer, a liquid crystal panel, an exposure mask thereof, and the like, a scanning electron microscope (hereinafter, referred to as a "SEM") is increasingly used. The process administrator measures the dimension of a pattern with a specific shape formed at a predetermined position in a wafer or the like, the distance between a plurality of patterns of a specific shape, or the like, using a SEM, and based on these results the process administrator controls a circuit device formed in a wafer or the like, the quality of the manufacturing process, and the like. In addition, the SEM used for such purpose is often called a length measuring SEM.

The inspection by the foregoing length measuring SEM is usually carried out automatically. That is, in an image (hereinafter, referred to as the "observation image" of a sample) of a sample surface, the image being generated in accordance with the amount of electrons emitted or reflected from the sample surface by irradiation of an electron beam, the length measuring SEM detects according to a predetermined pattern matching method a position on the observation image, where the image agrees with a pattern (hereinafter, referred to as a "registered pattern") of a specific shape being registered in advance (hereinafter, such a position detection is referred to as a "position matching"), and measures the distance between a plurality of registered patterns, for example. At this time, as the registered pattern used for the position matching, a CAD (Computer Aided Design) data created at the time of design is usually employed. Moreover, as the method of a pattern matching, a normalized correlation method or a generalized Hough conversion method is usually used.

Incidentally, in a semiconductor wafer or the like to be inspected, the finer a structure (pattern of a predetermined quality of material) formed on a semiconductor wafer, the more often the structure is not formed like the pattern of the CAD data because of the variations and the like in the manufacturing. For example, a line width in a metal wiring layer may become larger or may become smaller than the line width based on the pattern of the CAD data. Moreover, if a pattern formed in a layer is a rectangular, its corner is usually formed roundly. Furthermore, depending on the quality of material of the formed layer, the observation image of the pattern of this layer by a SEM may look larger or smaller than the actually formed size. Accordingly, the pattern corresponding to the registered pattern in the observation image is often deformed as compared with the registered pattern in the CAD data.

Moreover, in the normalized correlation method or the generalized Hough conversion method, based on the edge extracted from the observation image of a sample and the edge generated from the registered pattern of a CAD data, a pattern matching is usually carried out. In this case, because the edge extracted from the observation image of a sample is often deformed, if a position matching is carried out with the registered pattern of the CAD data, a sufficient positional accuracy may not be obtained or the pattern matching may fail in some cases. One of the reasons resides in the matching algorithm itself of the normalized correlation method or the generalized Hough conversion method.

When a pattern matching between the edges of two images to be inspected is carried out using the normalized correlation method, the normalized correlation method attempts to match even parts of the both edges to each other. For this reason, with the normalized correlation method, the registered pattern is pulled toward the direction of a high degree of coincidence of the edge between the edge of the registered pattern and the edge of the observation image to thereby match with the pattern of the observation image. Moreover, because the direction of a high degree of coincidence of the edge varies depending on the deformation condition of the pattern of the observation image, it will not settle to a uniform direction. Accordingly, a sufficient positional accuracy cannot be obtained in the position matching with the use of the normalized correlation method.

Moreover, the generalized Hough conversion method is also a matching algorithm which attempts to match the edges of two images to each other. In the generalized Hough conversion method, the pattern matching is carried out by carrying out rotation, enlargement and reduction of a pattern, however, for this reason, if the matching is carried out by carrying out enlargement, reduction, and the like to a part of the pattern (portion with a high degree of coincidence), there is inconvenience that the scale fails to agree in other part of the pattern. Moreover, because the scale varies depending on the deformation condition of the pattern of the observation image, it will not settle to a certain value. Accordingly, a sufficient positional accuracy cannot be obtained also in the position matching with the use of the generalized Hough conversion method.

In JP-A-2002-328015 (Paragraph 0053 to Paragraph 0060, FIG. 2 to FIG. 10, corresponding to U.S. Pat. No. 7,026,615), there is disclosed an example of SEM in which one of wafers or the like to be inspected is taken out, and after observing a pattern formed in this wafer or the like by SEM, the pattern obtained from this observation image is re-registered as a registered pattern, and based on this re-registered pattern, a pattern matching is carried out to other wafers or the like to be inspected. In this SEM, not a pattern of a CAD data but a pattern obtained from the observation image of a semiconductor wafer or the like to be inspected, the observation image being observed by this SEM, is used as the registered pattern. Accordingly, because the difference between the shape of the registered pattern and the shape of the pattern to be inspected becomes small, the probability of failing in the pattern matching will decrease. That is, the success rate of the pattern matching can be improved.

However, in case of the pattern matching technique shown in JP-A-2002-328015, an additional work to observe, by SEM, a pattern formed in a wafer or the like to be inspected, and to re-register the pattern obtained from this observation image as a registered pattern is needed. This work can not help but depending on man power and needs to be carried out for each type of product of an integrated circuit or the like formed in a wafer to be inspected. Accordingly, the efficiency of the inspection work, such as a length measurement, will decrease significantly.

Moreover, in JP-A-2002-328015, a matching algorithm such as the normalized correlation method which attempts to match the edges of two images to each other is used. Then, as the registered pattern, the one obtained from the observation image is used. However, in the manufacturing process of a semiconductor or the like, the pattern of a layer formed in a wafer or the like will inevitably have deformation as described above. Accordingly, also in case of JP-A-2002-328015, as long as the matching algorithm which attempts to match the edges of two images to each other is used, the accuracy of a position matching by the pattern matching cannot be improved.

SUMMARY OF THE INVENTION

In view of the above-described problems of the conventional techniques, it is an object of the present invention to provide an image processing system which can improve the success rate and accuracy of a pattern matching between two images and moreover which does not involve a decrease in efficiency of the inspection work, such as a length measurement, and to provide a method of processing images, and a scanning electron microscope.

According to an aspect of the present invention, an image processing system for carrying out a pattern matching between a first image and a second image, includes: a gravity point distribution image generation means for generating a gravity point distribution image based on the first image; an edge line segment group generation means for generating a group of edge line segments based on the second image; a matching score calculation means for calculating a matching score based on the gravity point distribution image and the group of edge line segments; and a maximum score position detection means for detecting a position where the matching score becomes the maximum.

Moreover, a scanning type microscope of the present invention carries out a position matching between an observation image and a registered pattern using the image processing system of the present invention described above.

In the image processing system of the present invention, with respect to the first image a gravity point distribution image is generated by the gravity point distribution image generation means. The gravity point distribution image is, so to speak, an image which indicates the distance from a gravity point position, wherein the position of a pixel, where the pixel value indicative of its luminosity is the maximum (or may be the minimum), is the gravity point. On the other hand, from the second image, a group of edge line segments is generated by the edge line segment group generation means. Subsequently, by the matching score calculation means, with respect to the generated group of edge line segments, the score to be calculated from the gravity point distribution image is calculated and the total sum thereof is made the matching score. Then, by the maximum score position detection means, a position where the matching score becomes the maximum is detected, and at this position it is determined that a pattern matching between the first image and the second image is succeeded.

In the present invention, two images subject to a pattern matching are not matched so that the edges of the respective images agree to each other, but they are matched so that the gravity point of the respective images agree to each other. As described above, deformation of the pattern of a structure formed in a semiconductor wafer or the like is primarily a deformation in which a line width or the like becomes larger or smaller, or the corner of a rectangular becomes rounded. In such deformation, the position of the gravity point of the pattern will not vary significantly. For this reason, even if one of the images subject to a pattern matching has such deformation, the pattern matching will not fail and a highly accurate pattern matching can be carried out.

Moreover, because in the scanning type microscope of the present invention, a registered pattern according to the CAD data can be used as the registered pattern, the re-registering operation of a registered pattern, which is carried out in JP-A-2002-328015, is not required. Accordingly, the efficiency in the inspection of a length measurement or the like will not decrease.

According to the present invention, the success rate and accuracy of a pattern matching with respect to two images can be improved, and, moreover, a decrease in the efficiency in the inspection of length measurement or the like using a scanning type microscope can be prevented.

Other objects, features and advantages of the invention will become apparent from the following description of the embodiments of the invention taken in conjunction with the accompanying drawings.

BRIEF DESCRIPTION OF THE DRAWINGS

FIG. 1 is a block diagram showing the configuration of a scanning electron microscope (SEM) concerning the present embodiment.

FIG. 2 is a view showing a flow chart of a pattern matching process carried out in an image processing system concerning the present embodiment.

FIGS. 5A, 5B, 5C and 5D are viewed showing a first example of generating a gravity point distribution image based on an observation image by SEM in the present embodiment.

FIGS. 7A and 7B are views showing an example of generating a group of edge line segments from an image.

FIGS. 8A and 8B are views showing an example of generating a group of edge line segments from an observation image by SEM in the present embodiment.

DESCRIPTION OF THE INVENTION

Figure 3A:
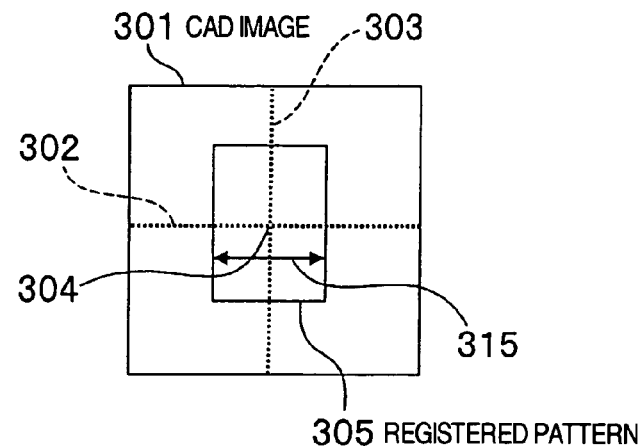
FIGS. 3A, 3B and 3C are views showing an example of generating a gravity point distribution image from a registered pattern of a CAD image in the present embodiment.

Hereinafter, the embodiments of the present invention will be described in detail with reference to FIG. 1 to FIG. 12.

FIG. 1 is a block diagram showing the configuration of a scanning electron microscope (SEM) concerning the present embodiment. As shown in FIG. 1, SEM 10 comprises a mirror body 1 including an electron gun 11, an electronic lens 12, a deflector 13, an electron detector 17, and the like, to which mirror body 1 an electron beam scanning controller 2, an observation image generator 3, an image processing system 4, and the like are coupled. In addition, an amplifier 18 is disposed in between the electron detector 17 and the observation image generator 3.

In the mirror body 1, an electron beam 14 is radiated from the electron gun 11 and irradiated to the surface of a sample 15. At this time, the electron beam 14 is focused by the electronic lens 12 and is controlled so that the focus thereof is positioned in the surface of the sample 15. Moreover, the deflector 13 is controlled by the electron beam scanning controller 2 and controls the deflection of the electron beam 14 so that the irradiation position (focal position) of the electron beam 14 scans a predetermined region in the surface of the sample 15.

When the electron beam 14 is irradiated to the surface of the sample 15, the reflection electrons of the electron beam 14 are radiated from the surface of the sample 15, and the secondary electrons from the inside of the sample 15. Here, the reflection electrons and secondary electrons will be referred to as emission electrons 16. The emission electrons 16 are detected by the electron detector 17, and the detected signal is amplified by the amplifier 18 and is inputted to the observation image generator 3 as an observation image signal. The observation image generator 3 carries out an AD (Analog to Digital) conversion of the inputted observation image signal and, based on the converted digital signal, it generates an observation image data which indicates the luminosity of each pixel of a two dimensional display image. The generated observation image data is sent to the image processing system 4 and is stored to an observation image storage 47.

The image processing system 4 comprises a computer including a non-illustrated CPU (Central Processing Unit) and storage devices, whereby the CPU carries out a program stored in the storage devices, thereby realizing predetermined functions of the image processing system 4. In the present embodiment, the program includes a paint-divided image generator 41, a gravity point distribution image generator 42, an edge line segment group generator 43, a matching score calculator 44, a maximum score position detector 45, and the like.

Moreover, the image processing system 4 further includes: a registered image storage 46 which stores a registered pattern serving as a reference of a pattern matching; an observation image storage 47 which stores an observation image data generated in the observation image generator 3; a CAD image storage (not shown) which stores a CAD image data of an integrated circuit or the like formed in the sample 15; a display 48 which displays the observation image and CAD image; and a communication device (not shown) coupled to LAN (Local Area Network).

Here, the CAD image data refers to a data, which indicates the outline for each layer to be formed through the manufacturing processes of the sample 15, out of the CAD data created at the time of designing the sample 15 (integrated circuit, liquid crystal, exposure mask, and the like). The CAD image data is stored in a design work station or the like and is usually obtained from the design work station or the like via LAN and the communication device, as required, such as at the time of carrying out inspection. Moreover, as to the registered pattern, from the CAD image a part thereof is cut out suitably, as required, such as at the time of carrying out inspection, and the cut out CAD image is made a registered pattern.

FIG. 2 is a view showing a flow chart of the pattern matching process carried out in the image processing system concerning the present embodiment. The image processing system 4 generates first a paint divided image of a registered pattern stored in the registered image storage 46 (Step S21). Because the CAD image data of an integrated circuit or the like is generally expressed by a closed geometry, when paint-dividing the registered pattern the inside or outside of the closed geometry just needs to be painted out.

Next, the generated paint divided image is smoothed to generate a gravity point distribution image (Step S22). The smoothing process of this paint divided image can be realized using a spatial filter, such as a Gaussian filter as well as a moving-average filter, and a high frequency component removal processing by means of a frequency analysis, or the like. In addition, generally, the smoothing process in the image processing is known as an image generation technique using low frequency components of the image, and therefore, for the smoothing process of Step S22, other image processing technique having a smoothing effect may be used.

Then, the image processing system 4 extracts the edge of the observation image of the sample 15 stored in the observation image storage 47, and generates a group of edge line segments of the observation image (Step S23). Here, the group of edge line segments refers to a collection of the line segments when the edge of a structure displayed as the observation image is displayed by straight line segments. In the process of generating this group of edge line segments, for example, after emphasizing the edge of the observation image by a differential filtering process such as a Sobel filter or a Laplacian filter, the edge is extracted by a binary conversion process and a thinning process is further applied to make the group of edge line segments.

Next, a matching score is calculated from the gravity point distribution image and the group of edge line segments generated in Steps S22 and S23, respectively (Step S24). As for the calculation of the matching score, when the gravity point distribution image is overlapped with the group of edge line segments, a value (hereinafter, refers to as a "pixel value") indicating the luminosity of a pixel at a position where each of the group of edge line segments is overlapped with the gravity point distribution image is obtained, and for example, the variance of the obtained pixel values for each line segment is calculated. In this case, the smaller the variance of the pixel values for each line segment, the closer the gravity point position of the gravity point distribution image generated from the registered pattern becomes to the gravity point position of the group of edge line segments generated from the observation image. Then, letting the variance of the pixel values of each line segment of the group of edge line segments be d, the matching score SC is calculated by the equation (1), $$SC = \exp(-d) \quad (1)$$

According to the equation (1), it can be determined that the larger the matching score SC, the closer the distance between the gravity point position of the registered pattern and the gravity point position of the observation image is.

Next, the relative position between the gravity point distribution image and the group of edge line segments is changed to calculate the matching score SC at each relative position, and a position where the matching score SC becomes the maximum is detected as the maximum score position (Step S25). The maximum score position detected in this way is the position where the gravity point distribution image is aligned with the group of edge line segments and is therefore the position where the registered pattern is aligned with the observation image. Then, this maximum score position is the result of the pattern matching.

Note that, although in the description of the process of the pattern matching described above, the definition of the gravity point position is a little ambiguous, the maximum score position calculated through this process is experientially stable with respect to the deformation of the pattern formed in a wafer or the like to be inspected. Accordingly, as compared with the case of the pattern matching using the conventional normalized correlation method or the like, the alignment accuracy can be improved surely.

Moreover, while FIG. 2 indicates that the gravity point distribution image is generated from the registered pattern and the group of edge line segments is generated from an observation image, thereby carrying out the pattern matching, on the contrary the gravity point distribution image may be generated from an observation image and the group of edge line segments may be generated from a registered pattern, thereby carrying out the pattern matching.

Moreover, here, as to the registered pattern, from the CAD image data a part thereof is cut out, however, from the observation image a part thereof may be cut out. In this case, the gravity point distribution image is generated from the observation image, the group of edge line segments is generated from other observation images, and a pattern matching is carried out between the observation images.

Moreover, in the paint divided image generation process of Step S21, when painting out a closed geometry of a registered pattern, a gravity point distribution image is generated in which the magnitude relation of the pixel value is reversed depending on whether either the inside or outside thereof is to be painted out. However, because the matching score SC follows the equation (1) and is calculated by the variance of the pixel values of each line segment of a group of edge line segments, the magnitude relation of the matching score SC at each relative position will not change even if the magnitude relation of the pixel value is reversed. Accordingly, even if either the inside or the outside is painted out, a pattern matching between a registered pattern and an observation image can be carried out in a similar manner.

Moreover, here, a pattern matching process is carried out to the group of edge line segments as a collection of straight line segments constituting the edge, however, a pattern matching process may be carried out to the group of edge line segments as a collection of points constituting the edge.

Hereinafter, in FIG. 3, to FIG. 12, the pattern matching process described above will be described using examples of specific images.

EXAMPLE 1 OF GENERATING A GRAVITY POINT DISTRIBUTION IMAGE

Figure 3B:
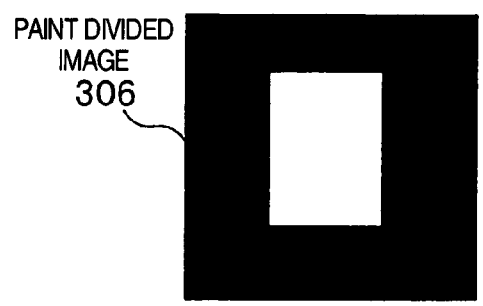
Figure 3C:
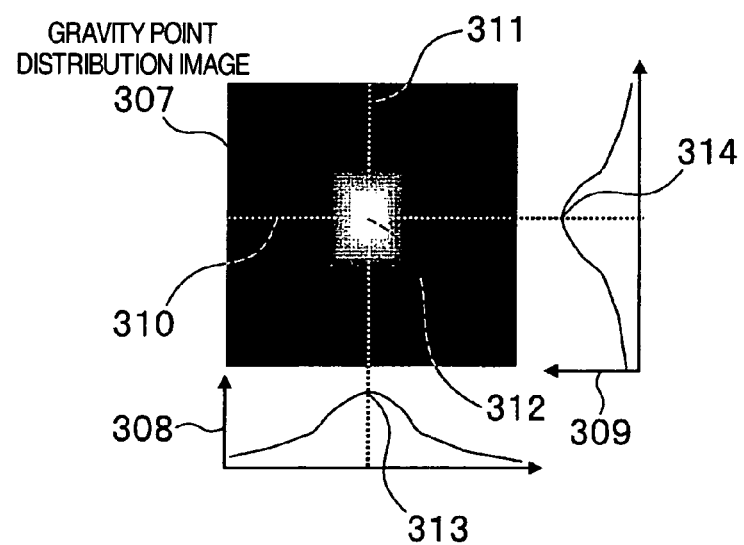
Figure 4A:
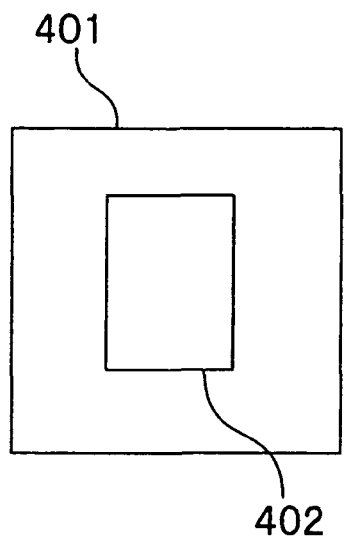
FIGS. 4A, 4B, 4C and 4D are views showing an example of generating a gravity point distribution image based on an exposure simulation in the present embodiment.
Figure 4B:
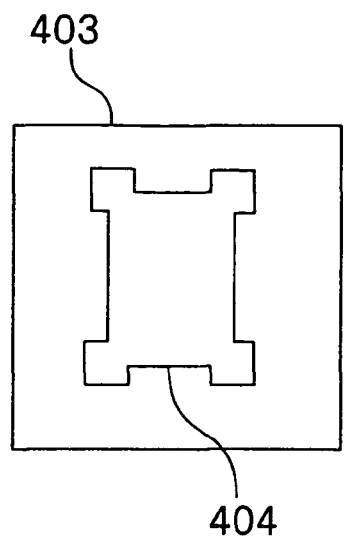
Figure 4C:
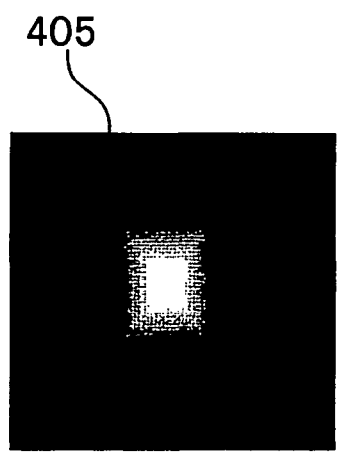
Figure 4D:
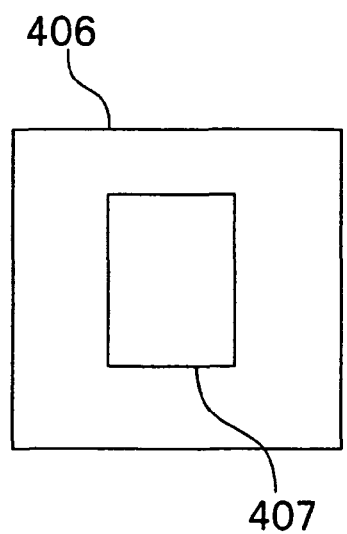

FIGS. 3A, 3B and 3C are views showing an example of generating a gravity point distribution image from a registered pattern of a CAD image. In FIG. 3A, CAD image 301 contains, for example, a registered rectangular pattern 305. At this time the registered pattern 305 is usually expressed as a list of coordinate data of the line segments, points, or the like, however, it may be expressed by a bitmap image data. At this time, a conversion to the bitmap image data from the information of the list of coordinate data can be carried out easily. Moreover, the center position 304 of the registered pattern 305 can be calculated easily from the coordinate data of the line segments of the rectangular. Note that a horizontal center line 302 and a vertical center line 303 of the registered pattern 305 are illustrated for reasons of the following description and are not actually drawn on the CAD image 301.

The image processing system 4, in the process of generating the paint divided image (Step S21), paint divides the CAD image 301 containing the registered pattern 305 to generate a paint divided image 306 (FIG. 3B). Here, the inside of the registered pattern 305 is paint divided with a white color, and the outside with a black color. Next, a smoothing process is applied to the image 306 to generate a gravity point distribution image 307 (FIG. 3C), (Step S22). Although also in the gravity point distribution image 307 a horizontal center line 310, a vertical center line 311, and a center position 312 are displayed, these correspond to the horizontal center line 302, the vertical center line 303, and the center position 304 displayed in the CAD image 301, respectively, and, like the latter ones, these are not actually drawn on the gravity point distribution image 307.

The characteristic of the gravity point distribution image 307 is that the pixel value varies gradually centered around the center position 312 whose coordinate is the same as that of the center position 304 of the registered pattern 305 on the CAD image 301. In FIG. 3C, a horizontal pixel value profile 308 is the pixel value profile on the horizontal center line 310 of the gravity point distribution image 307, and a vertical pixel value profile 309 is the pixel value profile on the vertical center line 311 of the gravity point distribution image 307.

Here, the horizontal pixel value profile 308 takes the maximum value 313 of the pixel value at the center position 312 and the pixel value becomes smaller gradually as being away from the maximum value 313. Moreover, the vertical pixel value profile 309 takes the maximum value 314 of the pixel value at the center position 312 and the pixel value becomes smaller gradually as being away from the maximum value 314. In addition, although here the pixel value profiles have been described taking the positions of the horizontal center line 310 and the vertical center line 311 as an example, in any one of the pixel value profiles on the straight lines passing through the center position 312, the pixel value becomes smaller as being away from the center position 312.

In this way, the gravity point distribution image 307 is the image reflecting the distance from the center position 304 of the CAD image 301. Moreover, because the gravity point distribution image 307 is the image in which a smoothing process is carried out with respect to the paint divided image 306 generated from the CAD image 301 to thereby emphasize low frequency components, it can be called an image reflecting the low frequency components of the shape of the CAD image 301.

Moreover, in the matching score calculation process (Step S24), in order to enable the calculation of the variance of a group of edge line segments over the entire region of the gravity point distribution image 307 and further enable the calculation of the matching score, it is preferable that the gravity point distribution image 307 be smoothed in advance so that the pixel value varies gradually over the entire region.

How far a smoothing process is carried out to the paint divided image 306 can be determined based on the size of the registered pattern 305 and the CAD image 301, i.e., the size of the paint divided image 306. At this time, a minimum line width 315 shows the minimum line width of the registered pattern 305 which exists inside the CAD image 301. The minimum line width 315 can be calculated by selecting the shortest line segment from the coordinate calculation of the CAD image 301, or by calculating the orthogonal distance with respect to all combinations of the coordinates, or the like. In addition, the minimum line width 315 is illustrated for convenience of description and is not drawn on the actual CAD image 301.

Generally, in the smoothing process, such as a Gaussian filter, the size for smoothing can be determined in accordance with the size of the filter. Accordingly, in order to carry out a smoothing process to the paint divided image 306 and smooth the same so that the pixel value varies gradually over the entire region, a smoothing filter with twice the size of the image may be used. However, in the case where the CAD image 301 is finer as compared with the filter size, the smoothing is carried out excessively, so that the shape of the CAD image 301 may not be distinguished. In order to prevent this phenomenon, the upper limit of the size of the smoothing filter may be set in advance based on the minimum line width 315.

FIGS. 4A, 4B, 4C and 4D are views showing an example of generating a gravity point distribution image based on an exposure simulation. For example, in the manufacturing process of a semiconductor integrated circuit or the like, in order to form a layer of circuit elements in a semiconductor wafer or the like, an exposure process is applied a plurality of times, and at the time of the exposure process, an exposure simulation is carried out in order to set the optical conditions and the like for the exposure. Because in this exposure simulation a light intensity image 405 corresponding to the gravity point distribution image is obtained, here the light intensity image 405 is used as the gravity point distribution image.

In the exposure simulation, a CAD image 401 (FIG. 4A) containing a registered pattern 402 is prepared and an exposure mask 403 is generated from the CAD image 401. The exposure mask 403 (FIG. 4B) contains a pattern 404 to which a shape change is added considering the optical interference conditions or the like with respect to the registered pattern 402 in advance. Then, when carrying out a simulation of a light energy distribution on the semiconductor wafer of at the time of transmitting light to the exposure mask 403, the light intensity image 405 (FIG. 4C) is generated during the course of this process. In addition, when the light intensity image 405 is binarized with an appropriate pixel value, a simulation image 406 (FIG. 4D) containing a rectangular 407 whose size is close to that of the registered pattern 402 will be generated as a result of the exposure simulation.

Because the light intensity image 405 obtained this way is the one expressing the distance from the center of the registered pattern 402 of the CAD image 401 and the shape due to a low frequency, the light intensity image 405 can be used as the gravity point distribution image.

EXAMPLE 3 OF GENERATING A GRAVITY POINT DISTRIBUTION IMAGE

FIGS. 5A, 5B, 5C, and 5D are views showing a first example of generating a gravity point distribution image based on the observation image by SEM. In FIGS. 5A, 5B, 5C, and 5D, in an observation image 501 (FIG. 5A) by SEM, it is observed that a structure 502 is enclosed by a bright edge called a white band. This is the reflection of a physical phenomenon that more electrons are detected from the corner of a structure rather than from a flat portion, and this is a phenomenon often seen in the observation image of SEM obtained in the inspection process and the like of the semiconductor manufacture.

In this example, first, the image processing system 4 carries out an extraction process of the edge to the structure 502, which contains the white band on the observation image 501, to thereby generate an edge image 503 (FIG. 5B) containing an edge 504 of the structure 502. Here, the extraction process of an edge can be carried out by further carrying out a binary conversion process using a Sobel filter and a Laplacian filter which are the existing image processing techniques. Next, the image processing system 4 carries out a paint dividing to two regions, which are divided by the edge 504, with a binary pixel value and generates a paint divided image 505 (FIG. 5C). Then, a gravity point distribution image 506 (FIG. 5D) is generated by carrying out a smoothing process to the paint divided image 505.

Because the gravity point distribution image 506 generated from the observation image 501 in this manner is the one expressing the distance from the center of the structure 502 and the shape due to a low frequency, a pattern matching with other observation image by SEM or with the group of edge line segments extracted from the CAD image can be achieved.

EXAMPLE 4 OF GENERATING A GRAVITY POINT DISTRIBUTION IMAGE

Figure 6A:
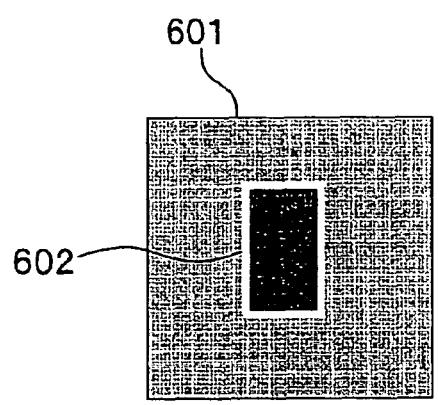
FIGS. 6A, 6B, 6C and 6D are views showing a second example of generating a gravity point distribution image based on an observation image by SEM in the present embodiment.
Figure 6C:
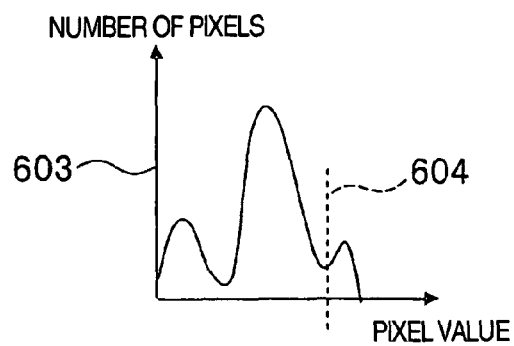
Figure 6B:
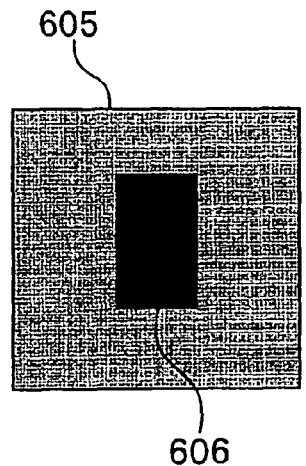
Figure 6D:
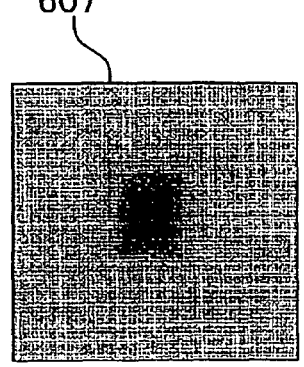

FIGS. 6A, 6B, 6C, and 6D are views showing a second example of generating a gravity point distribution image based on the observation image by SEM. Also in this example, in an observation image 601 (FIG. 6A), a white band enclosing a structure 602 is observed. The image processing system 4 carries out a process of filling pixels having the pixel value of the white band with a peripheral pixel value, first, erases this white band, and generates a region image 605 (FIG. 6B).

The process of filling the white band with a peripheral pixel value is carried out by utilizing that the pixel value in the white band is larger than that of other regions. That is, the image processing system 4 creates a histogram 603 (FIG. 6C) of the observation image 601 by SEM, and decides the pixel value in the white band from this histogram 603. Here, the horizontal axis of the histogram 603 represents the pixel value, and the vertical axis represents the frequency of this pixel value, i.e., the number of pixels. Next, the image processing system 4 extracts a threshold 604 of the pixel value from the histogram 603, and decides that the pixels, wherein the pixel value of the observation image 601 is larger than the threshold value 604, are the pixels contained in the white band. Then, with respect to the pixel whose pixel value has been decided to be the threshold 604 or more, a process to fill with the pixel existing at the closest to the relevant pixel and having the pixel value smaller than the threshold 604 is carried out. Then, by carrying out this process to all the pixels whose pixel value is the threshold 604 or more, the region image 605 is generated.

Then, the image processing system 4 generates a gravity point distribution image 607 (FIG. 6D) by carrying out a smoothing process to the region image 605. Because the gravity point distribution image 607 generated in this manner is the one expressing the distance from the center of the structure 602 and the shape due to the low frequency, a pattern matching with other observation image by SEM or with the group of edge line segments extracted from the CAD images is possible.

EXAMPLE 1 OF GERERATING A GROUP OF EDGE LINE SEGMENTS

FIGS. 7A and 7B are views showing an example of generating a group of edge line segments from a CAD image. As shown in FIG. 7A, a pattern, such as a rectangular 702 contained in a CAD image 701, is usually expressed with a visible outline expressing the shape thereof. That is, a pattern, such as the rectangular 702, is expressed as a list of coordinate data of line segments, points, or the like, in the image processing system 4. Then, the image processing system 4 obtains the coordinate data of line segments from a list of coordinate data of the line segments, or points, or the like and generates a group of edge line segments 703 (FIG. 7B).

EXAMPLE 2 OF GENERATING A GROUP OF EDGE LINE SEGMENTS

FIGS. 8A and 8B are views showing an example of generating a group of edge line segments from an observation image by SEM. The image processing system 4 applies a differential filtering, such as a Sobel filter and a Laplacian filter, to an observation image 801 (FIG. 8A) to thereby emphasize the edge information on a structure 802. Then, the image processing system 4 extracts pixels having a high pixel value by using a binary conversion process, carries out thinning, and generates a group of edge line segments 803 (FIG. 8B). At this time, the line segment of the group of edge line segments 803 is expressed with the coordinate data of its start point and end point.

EXAMPLE 1 OF CALCULATING A MATCHING SCORE

Figure 9A:
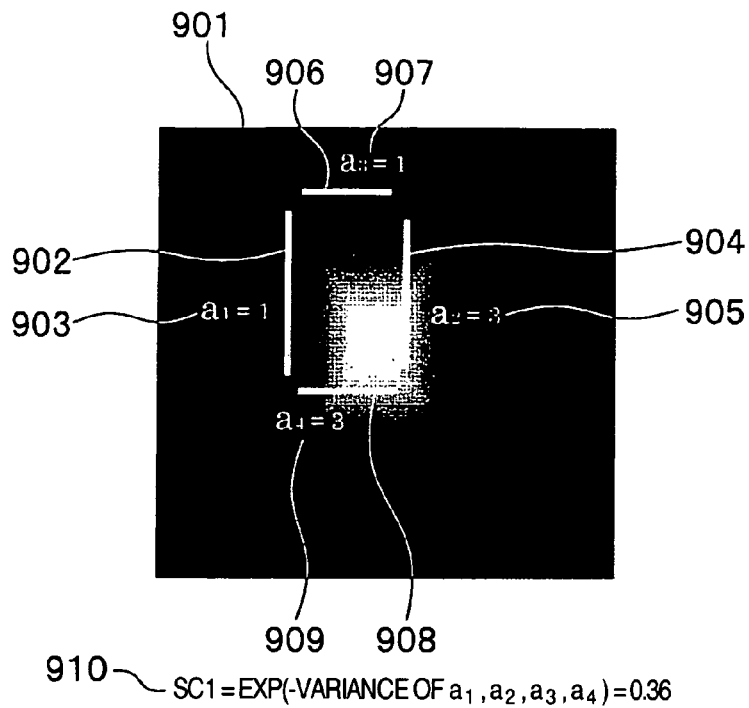
FIGS. 9A and 9B are views showing a first example, in which a group of edge line segments is overlapped with a gravity point distribution image to thereby calculate a matching score, in the present embodiment.
Figure 9B:
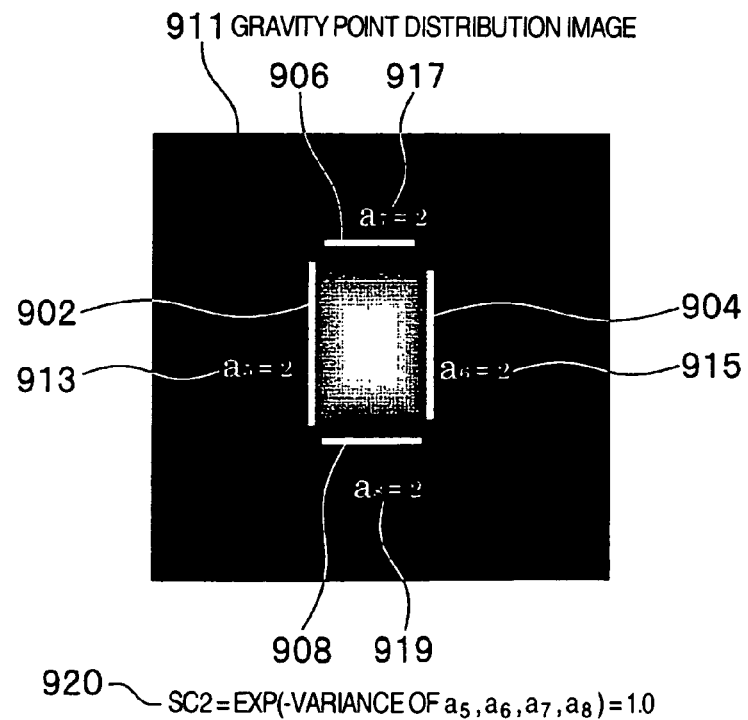

FIGS. 9A and 9B are views showing a first example in which a group of edge line segments is overlapped with a gravity point distribution image to thereby calculate a matching score. Although in FIGS. 9A and 9B there are shown gravity point distribution images 901 (FIG. 9A) and 911 (FIG. 9B) in which groups of edge line segments are overlapped by changing the position into two kinds, an example of calculating a matching score using the gravity point distribution image 901 will be described first.

The image processing system 4 overlaps edge line segments 902, 904, 906, and 908 on top of the gravity point distribution image 901 to thereby obtain a pixel value at a position where each edge line segment is overlapped with the gravity point distribution image 901. That is, a pixel value 903 ($a_1$=1) is obtained for the edge line segment 902, a pixel value 905 ($a_2$=3) for the edge line segment 904, a pixel value 907 ($a_3$=1) for the edge line segment 906, and a pixel value 909 ($a_4$=3) for the edge line segment 908. Next, the variance of these pixel values 903, 905, 907, and 909 is calculated (variance=1), and a matching score 910 is calculated in accordance with the above equation (1) (SC1=0.36).

Next, the image when the relative position of the group of edge line segments is changed relative to the gravity point distribution image 901 is made a gravity point distribution image 911. The image processing system 4 overlaps the edge line segments 902, 904, 906, and 908 on top of the gravity point distribution image 911 to thereby obtain a pixel value at a position where each edge line segment is overlapped with the gravity point distribution image 911. That is, a pixel value 913 ($a_5$=2) is obtained for the edge line segment 902, a pixel value 915 ($a_6$=2) for the edge line segment 904, a pixel value 917 ($a_7$=2) for the edge line segment 906, and a pixel value 919 ($a_8$=2) for the edge line segment 908. Next, the variance of these pixel values 913, 915, 917, and 919 is calculated (variance=0), and a matching score 920 is calculated in accordance with the equation (1) (SC2=1.0).

In FIGS. 9A and 9B, because in case of the gravity point distribution image 901, the center of the edge line segment 902, 904, 906, and 908 is off the center of the gravity point distribution image, there is a variation in the pixel values 903, 905, 907, and 909. Accordingly, in the equation (1), the variance d becomes large and the matching score SC becomes small. On the other hand, because in case of the gravity point distribution image 911, the center of the edge line segments 902, 904, 906, and 908 is close to the center of the gravity point distribution image, there is almost no variation in the pixel values 913, 915, 917, and 919. Accordingly, in the equation (1), the variance becomes small and the matching score SC becomes large.

In addition, as for the method of calculating the matching score, not a method of calculating based on the variance like in the equation (1), but a method, in which with respect to the average of the pixel value at a position corresponding to a line segment, the frequency of the pixel value within a certain range from the average is calculated as the score, and the like may be used. Moreover, when being overlapped with the edge line segment, the score is not calculated from the pixel value of the gravity point distribution image corresponding to the position of the edge line segment, but a first derivative value or a second derivative value at the position of the gravity point distribution image corresponding to the position of the edge line segment is calculated, and based on the variance thereof or the average thereof, the matching score may be calculated.

EXAMPLE 2 OF CALCULATING A MATCHING SCORE

Figure 10:
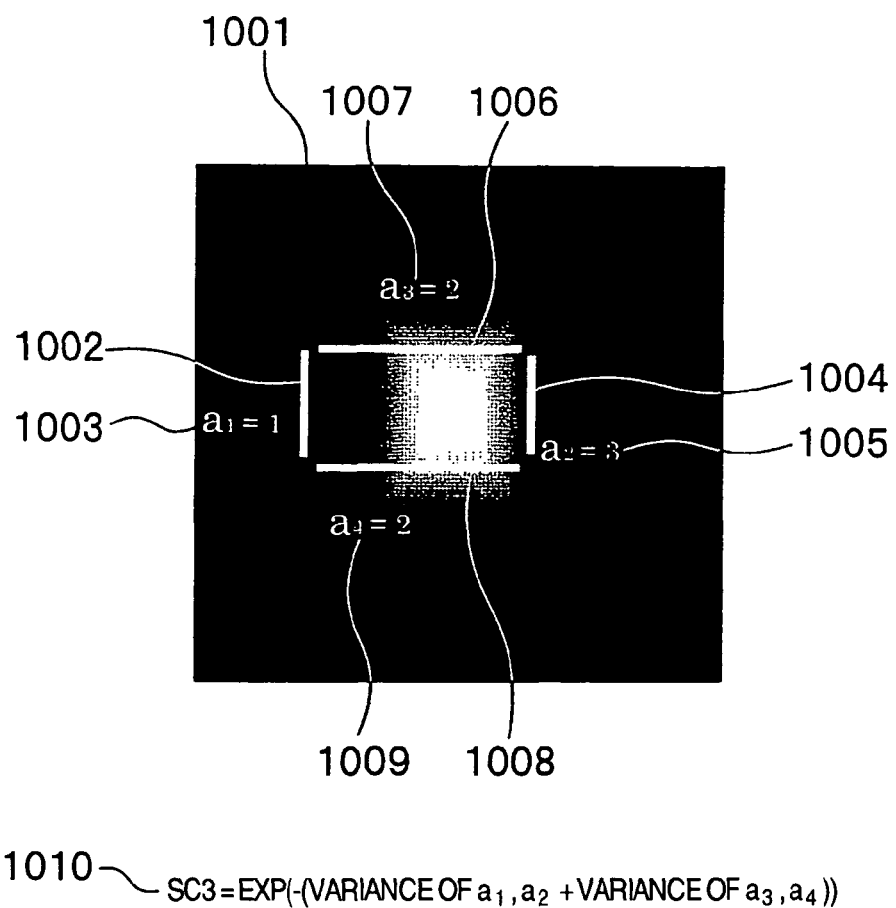
FIG. 10 is a view showing a second example, in which a group of edge line segments is overlapped with a gravity point distribution image to thereby calculate a matching score, in the present embodiment.

FIG. 10 is a view showing a second example in which a group of edge line segments is overlapped with a gravity point distribution image to thereby calculate the matching score. The image processing system 4 overlaps edge line segments 1002, 1004, 1006, and 1008 on top of a gravity point distribution image 1001 to thereby obtain the pixel value at a position where each edge line segment is overlapped with the gravity point distribution image 1001. That is, a pixel value 1003 ($a_1$=1) is obtained for the edge line segment 1002, a pixel value 1005 ($a_2$=3) for the edge line segment 1004, a pixel value 1007 ($a_3$=2) for the edge line segment 1006, and a pixel value 1009 ($a_4$=2) for the edge line segment 1008.

Next, the image processing system 4 group-divides the edge line segments 1002, 1004, 1006, and 1008 of the group of edge line segments with multiple directions. Here, the edge line segments 1002 and 1004 are a group of vertical line segments, and the edge line segments 1006 and 1008 are a group of horizontal line segments. Then, the image processing system 4 calculates the variance of the pixel value corresponding to each edge line segment for each group, and calculates a matching score SC3 in accordance with a formula for computation 1010 of the matching score. That is, the matching score SC3 is calculated based on the sum of the variance of the pixel value 1003 and the pixel value 1005, and the variance of the pixel value 1007 and the pixel value 1009.

As described above, if the variance is calculated by dividing into a group of vertical line segments and a group of horizontal line segments to thereby calculate the matching score, the center position of the gravity point distribution image can be matched with the center position of the group of edge line segments more correctly even in the case where the magnitude of the shape deformation between the gravity point distribution image and the group of edge line segments differs in the vertical direction and in the horizontal direction.

In addition, as for the method of calculating the matching score, not a method of calculating based on the variance like in the equation (1), but a method, in which with respect to the average of the pixel values at the position corresponding to the line segment, the frequency of the pixel value within a certain range from the average is calculated as the score, and the like may be used. Moreover, when being overlapped with the edge line segment, the score is not calculating from the pixel value of the gravity point distribution image corresponding to the position of the edge line segment, but a first derivative value or a second derivative value at the position of the gravity point distribution image corresponding to the position of the edge line segment is calculated, and based on the variance thereof or the average thereof the matching score may be calculated.

Moreover, like in this example, also in the case where a group of edge line segments is separated with multiple directions, the score may be calculated, like in FIG. 9, from the average of the pixel value of the position corresponding to the line segment, instead of calculating the score by the variance in accordance with the matching score formula 1010. Moreover, the first derivative value or second derivative value of the pixel value of a pixel at a position of the gravity point distribution image corresponding to the position of the edge line segment may be calculated, and based on the variance or average thereof the score may be calculated.

Figure 11A:
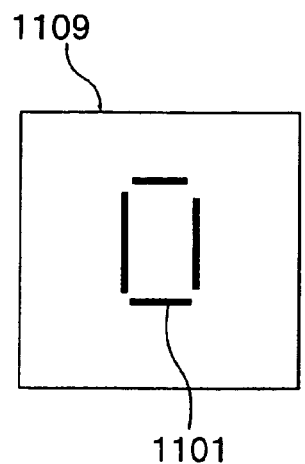
FIGS. 11A, 11B, 11C, 11D and 11E are views showing an example of a pattern matching between a group of edge line segments and a contour line image generated from a gravity point distribution image.
Figure 11B:
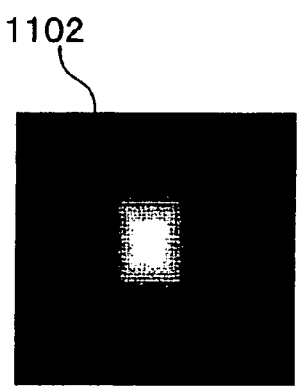
Figure 11C:
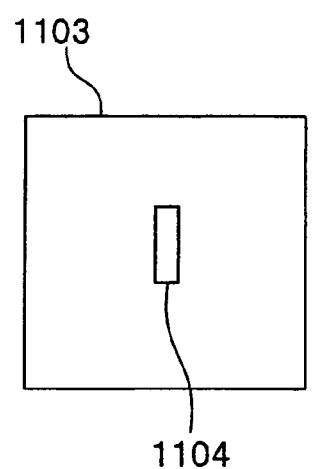
Figure 11D:
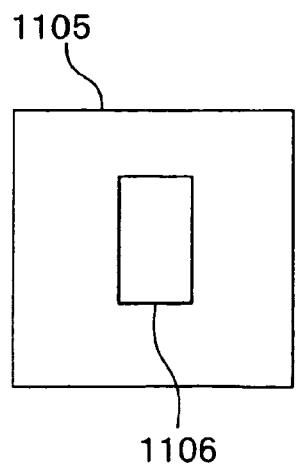
Figure 11E:
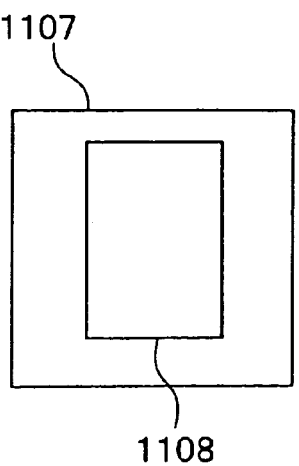

FIGS. 11A, 11B, 11C, 11D and 11E are views showing an example of a pattern matching between a group of edge line segments and a contour line image generated from a gravity point distribution image. First, the image processing system 4 binarizes a gravity point distribution image 1102 (FIG. 11B) with a predetermined pixel value being as a threshold, extracts an edge from the binarized image, and generates contour line images 1103 (FIG. 11C), 1105 (FIG. 11D), and 1107 (FIG. 11E). Here, the contour line image 1103 is generated by binarizing the gravity point distribution image 1102 with a high threshold, the contour line image 1105 is generated by binarizing with an intermediate threshold, and the contour line image 1107 is generated by binarizing with a low threshold. In this case, a small rectangular 1104 is generated in the contour line image 1103 which has been binarized with a high threshold, an intermediate size rectangular 1106 is generated in the contour line image 1105 which has been binarized with an intermediate threshold, and a large rectangular 1108 is created in the contour line image 1107 which has been binarized with a low threshold.

Next, the image processing system 4 creates an edge image 1109, which contains a group of edge line segments 1101 (FIG. 11A) subject to a pattern matching, from a predetermined CAD image or an observation image. Then, with respect to the edge image 1109 and the contour line images 1103, 1105, and 1107, a pattern matching is carried out based on a normalized correlation method. In this case, the edge image 1109, when being pattern matched with a contour line image having a rectangular of a size as much similar to that of the group of edge line segment 1101 as possible, can obtain the highest normalized correlation value. That is, a rectangular of the contour line image out of a plurality of contour line images, in which the highest normalized correlation value is obtained, is close to the group of edge line segments 1101 of the edge image 1109, and therefore the alignment also can be carried out with a sufficient accuracy by this pattern matching.

When this example is applied to a pattern matching between a light intensity image obtained in the exposure simulation in the manufacturing process of a semiconductor integrated circuit or the like, and an observation image by SEM, a light intensity image is used as the gravity point distribution image and an edge image generated from the observation image is used as the group of edge line segments, thereby enabling a precise alignment between the light intensity image and the observation image and also enabling an adequate threshold setup.

In addition, in this example, the pattern matching method is not restricted to the normalized correlation method, but in place of the normalized correlation method, a pattern matching such as a generalized Hough conversion method which matches an image with an image may be used.

EXAMPLE OF PATTERN MATCHING BETWEEN GRAVITY POINT DISTRIBUTION IMAGES

Figure 12A:
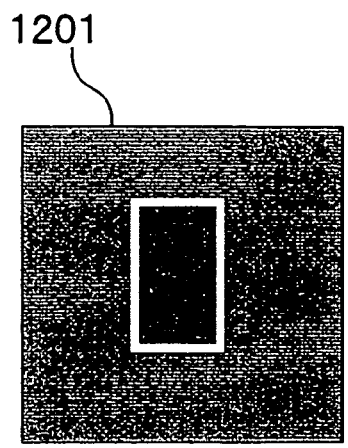
FIGS. 12A, 12B, 12C and 12D are views showing an example, in which a pattern matching is carried out between gravity point distribution images, in the present embodiment.
Figure 12B:
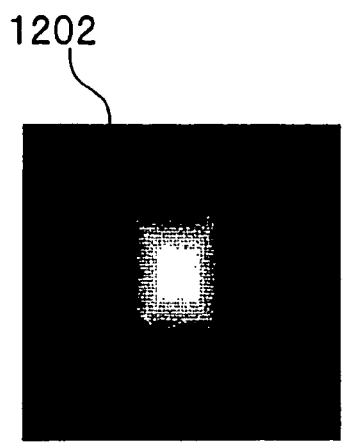
Figure 12C:
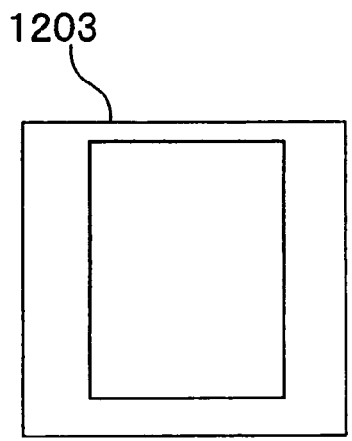
Figure 12D:
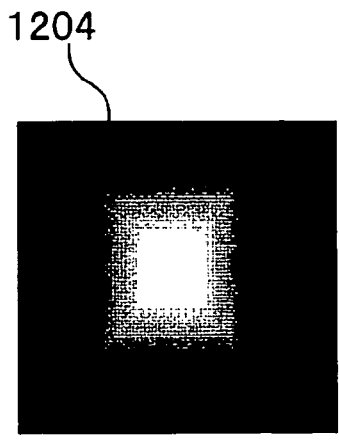

FIGS. 12A, 12B, 12C, and 12D are views showing an example of carrying out a pattern matching between gravity point distribution images. In this example, the image processing system 4 generates a gravity point distribution image 1202 (FIG. 12B) from an observation image 1201 (FIG. 12A). This generation can be carried out in accordance with the method shown in FIG. 5 or FIG. 6. Moreover, the image processing system 4 generates a gravity point distribution image 1204 (FIG. 12D) from a CAD image 1203 (FIG. 12C). This generation can be carried out in accordance with the method shown in FIG. 3 or FIG. 4.

With respect to the gravity point distribution images 1202 and 1204 generated in this manner, the image processing system 4 carries out a pattern matching in accordance with the normalized correlation method, calculates the center position of the mutual patterns and carries out alignment of the center positions. That is, with this method, the pattern matching and alignment can be carried out simultaneously. Note that, in this case, it is necessary to align the change (gradient) of the pixel value toward the center of the gravity point distribution image 1202 with that of the gravity point distribution image 1204.

In addition, as for the method of the pattern matching shown in this example, a pattern matching for aligning the center positions by the use of a combination of an observation image and an observation image, or a combination of a CAD image and a CAD image, other than the combination of the observation image 1201 and the CAD image 1203, is possible.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An image processing system for carrying out a pattern matching between a first image and a second image, comprising:
   a gravity point distribution image generator for generating a gravity point distribution image based on the first image, pixel values of the gravity point distribution image respectively varying with distance from a gravity point which is a center of a pattern in the gravity point distribution image;
   a contour line image generator for generating a contour line image consisting of a plurality of contour line patterns based on the gravity point distribution image;
   an edge line segment group generator for generating a group of edge line segments based on the second image; and
   a pattern matching unit for carrying out a pattern matching between the plurality of contour line patterns and an edge line segment constituting the group of edge line segments.

2. The image processing system according to claim 1, wherein the gravity point distribution image generator generates a paint divided image based on the first image and smoothes the generated paint divided image.

3. The image processing system according to claim 1, wherein the gravity point distribution image generator comprises an exposure simulator for carrying out an exposure simulation using an exposure mask based on the first image.

4. An image processing method for carrying out a pattern matching between a first image and a second image by means of a computer, the method to be carried out by the computer comprising steps of:

generating a gravity point distribution image based on the first image, pixel values of the gravity point distribution image respectively varying with distance from a gravity point which is a center of a pattern in the gravity point distribution image;

generating a contour line image consisting of a plurality of contour line patterns based on the gravity point distribution image;

generating a group of edge line segments based on the second image; and carrying out a pattern matching between the plurality of contour line patterns and an edge line segment constituting a group of edge line segments.

5. The image processing method according to claim 4, wherein the gravity point distribution image generating step comprises:

generating a paint divided image based on the first image; and smoothing the generated paint divided image.

6. The image processing method according to claim 4, wherein the gravity point distribution image generating step comprises carrying out an exposure simulation using an exposure mask based on the first image.

7. A scanning electron microscope, comprising:

an electronic beam scanning controller for carrying out a scanning control of an electron beam so that the irradiation region of the electron beam scans a predetermined region of a sample;

an observation image generator which detects, when the sample is irradiated with the electron beam, electrons emitted from the region of the sample irradiated with the electron beam, and generates, based on the amount of the detected electrons, an observation image of the region of the sample scanned by the electron beam;

an image processor for carrying out a pattern matching between a first image and a second image, at least one of which being the observation image, wherein the image processor comprises:

a gravity point distribution image generator for generating a gravity point distribution image based on the first image, pixel values of the gravity point distribution image respectively varying with distance from a gravity point which is a center of a pattern in the gravity point distribution image;

a contour line image generator for generating a contour line image consisting of a plurality of contour line patterns based on the gravity point distribution image;

an edge line segment group generator for generating a group of edge line segments based on the second image; and a pattern matching unit for carrying out a pattern matching between the plurality of contour line patterns and an edge line segment constituting the group of edge line segments.

8. The scanning electron microscope according to claim 7, wherein the gravity point distribution image generator is configured to:

generate a paint divided image based on the first image; and smooth the generated paint divided image.

9. The scanning electron microscope according to claim 7, the gravity point distribution image generator is configured to carry out an exposure simulation using an exposure mask based on the first image.

* * * * *